US012810949B2

(12) United States Patent
Li et al.

(10) Patent No.: US 12,810,949 B2
(45) Date of Patent: Nov. 24, 2026

(54) BUILT IN SELF-TEST CIRCUITS FOR VOLTAGE VERIFICATION IN NONVOLATILE MEMORY

(71) Applicant: Sandisk Technologies, Inc., Milpitas, CA (US)

(72) Inventors: Ting Li, Shanghai (CN); Zhen Qin, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 161 days.

(21) Appl. No.: 19/060,822

(22) Filed: Feb. 24, 2025

(65) Prior Publication Data

US 2026/0253647 A1 Aug. 27, 2026

(51) Int. Cl.

| | |
|---|---|
| ***G11C 11/34*** | (2006.01) |
| ***G11C 16/30*** | (2006.01) |
| ***G11C 16/32*** | (2006.01) |
| *G11C 16/04* | (2006.01) |

(52) U.S. Cl.

CPC .............. *G11C 16/30* (2013.01); *G11C 16/32* (2013.01); *G11C 16/0483* (2013.01)

(58) Field of Classification Search

CPC ...... G11C 16/30; G11C 16/32; G11C 16/0483

USPC ..................................................... 365/185.21

See application file for complete search history.

(56) References Cited

U.S. PATENT DOCUMENTS

| | | | | |
|---|---|---|---|---|
| 5,696,730 | A * | 12/1997 | Slezak | G11C 8/18 365/233.5 |
| 5,923,601 | A | 7/1999 | Wendell | |
| 5,936,892 | A | 8/1999 | Wendell | |
| 6,801,869 | B2 * | 10/2004 | McCord | G11C 29/006 702/117 |
| 6,842,384 | B2 * | 1/2005 | Lee | G11C 8/10 365/230.06 |
| 7,424,657 | B2 * | 9/2008 | Zettler | G01R 31/318511 714/733 |
| 7,633,824 | B2 * | 12/2009 | Kato | H02M 3/07 365/189.09 |
| 7,768,856 | B2 * | 8/2010 | Fook | G11C 16/30 365/189.09 |
| 8,149,638 | B2 * | 4/2012 | Kurosawa | G11C 29/025 365/201 |
| 8,154,927 | B2 * | 4/2012 | Lee | G11C 16/0408 365/185.23 |
| 8,379,455 | B2 * | 2/2013 | Kuroda | G11C 29/12 365/185.24 |
| 8,854,073 | B2 | 10/2014 | Grosch et al. | |

(Continued)

FOREIGN PATENT DOCUMENTS

| | | | | |
|---|---|---|---|---|
| CN | 104795095 | A * | 7/2015 | G11C 11/1673 |
| CN | 111512380 | A * | 8/2020 | G11C 13/0064 |

(Continued)

*Primary Examiner* — Viet Q Nguyen

(74) *Attorney, Agent, or Firm* — Pearl Cohen LLP

(57) ABSTRACT

An apparatus includes one or more control circuits configured to connect to a plurality of nonvolatile memory cells. The one or more control circuits are configured to receive memory access voltages in parallel with a clock signal, select a different memory access voltage during each clock pulse and determine whether each memory access voltage meets a requirement.

20 Claims, 16 Drawing Sheets

(56) References Cited

U.S. PATENT DOCUMENTS

| | | | | |
|---|---|---|---|---|
| 8,874,631 | B2 * | 10/2014 | Matsumoto | G06F 7/588 708/250 |
| 9,030,865 | B2 * | 5/2015 | Chow | G11C 11/1675 365/158 |
| 9,299,927 | B2 * | 3/2016 | Hsieh | H10N 70/8833 |
| 9,378,765 | B2 * | 6/2016 | Cai | H03M 13/658 |
| 9,934,872 | B2 | 4/2018 | Magia et al. | |
| 10,319,456 | B2 * | 6/2019 | Chiu | G11C 29/14 |
| 10,762,960 | B2 * | 9/2020 | Chih | H10B 63/80 |
| 11,551,764 | B2 * | 1/2023 | Kwon | G11C 16/0483 |
| 12,266,414 | B2 * | 4/2025 | Park | G11C 29/36 |
| 12,658,265 | B2 * | 6/2026 | Zhao | G11C 16/26 |

FOREIGN PATENT DOCUMENTS

| | | | | | |
|---|---|---|---|---|---|
| CN | 111667866 | A | * | 9/2020 | G11C 16/10 |
| DE | 4025640 | C2 | * | 5/1992 | G06F 11/1076 |
| KR | 20030035711 | A | * | 5/2003 | G11C 29/50012 |
| KR | 100604939 | B1 | * | 7/2006 | G11C 16/0483 |

* cited by examiner

BUILT IN SELF-TEST CIRCUITS FOR VOLTAGE VERIFICATION IN NONVOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise nonvolatile memory or volatile memory. A nonvolatile memory allows information to be stored and retained even when the nonvolatile memory is not connected to a source of power (e.g., a battery).

One type of nonvolatile memory has strings of nonvolatile memory cells that have a select transistor at each end of the string. Typically, such strings are referred to as NAND strings. Nonvolatile memory cells may also be referred to as nonvolatile memory cell transistors, with the channels of the nonvolatile memory cell transistors collectively being referred to as a NAND string channel.

Operating a nonvolatile memory may include applying various voltages to nonvolatile memory cells in a nonvolatile memory structure (array) in order to program, read and erase memory cells. In some cases, suitable voltages may be generated from a supply voltage using one or more charge pumps and/or driver circuits that output appropriate voltages. Bad voltages (e.g., outside of a predetermined range) may impact memory operation. Testing may determine whether voltages meet appropriate metrics and a die that fails such testing may be designated as a bad die and discarded. Efficiently and accurately performing such testing may be challenging.

BRIEF DESCRIPTION OF THE DRAWINGS

Like-numbered elements refer to common components in the different figures.

DETAILED DESCRIPTION

Circuits and techniques are provided for testing memory access voltages that may be used for memory access operations including read, write and erase operations. A circuit (e.g., Built-in Self-test or BIST circuit) may receive a clock signal and may perform testing of different voltages during different clock pulses (e.g., testing a first voltage during a first pulse, testing a second voltage during a second pulse and so on). A self-test circuit may include a voltage divider to generate a divided voltage from a voltage being tested and provide the divided voltage to a comparator to be compared with a reference voltage (e.g., to determine if the voltage being tested is above a lower limit or minimum voltage). The voltage divider may include variable resistors that are configurable from pulse to pulse according to the voltage being tested during the pulse. At each clock pulse the comparator may output a result for a corresponding voltage (e.g., a high/low signal corresponding to a pass/fail result). In response to a fail result, additional testing may provide additional information regarding the failed voltage (e.g., for failure analysis purposes), For example, an approximate value or narrower range for the failed voltage may be obtained (e.g., in addition to the fail result indicating a voltage range below the corresponding voltage limit, the voltage may be found to be, for example, between 5 volts and 6 volts or within some other range).

Aspects of the present technology are directed to problems associated with efficient and speedy testing of memory access voltages in a data storage system. Aspects of the present technology provide technical solutions including circuits and methods that test memory access voltages during respective clock pulses of a clock signal so that testing proceeds rapidly from voltage to voltage.

Figure 1:
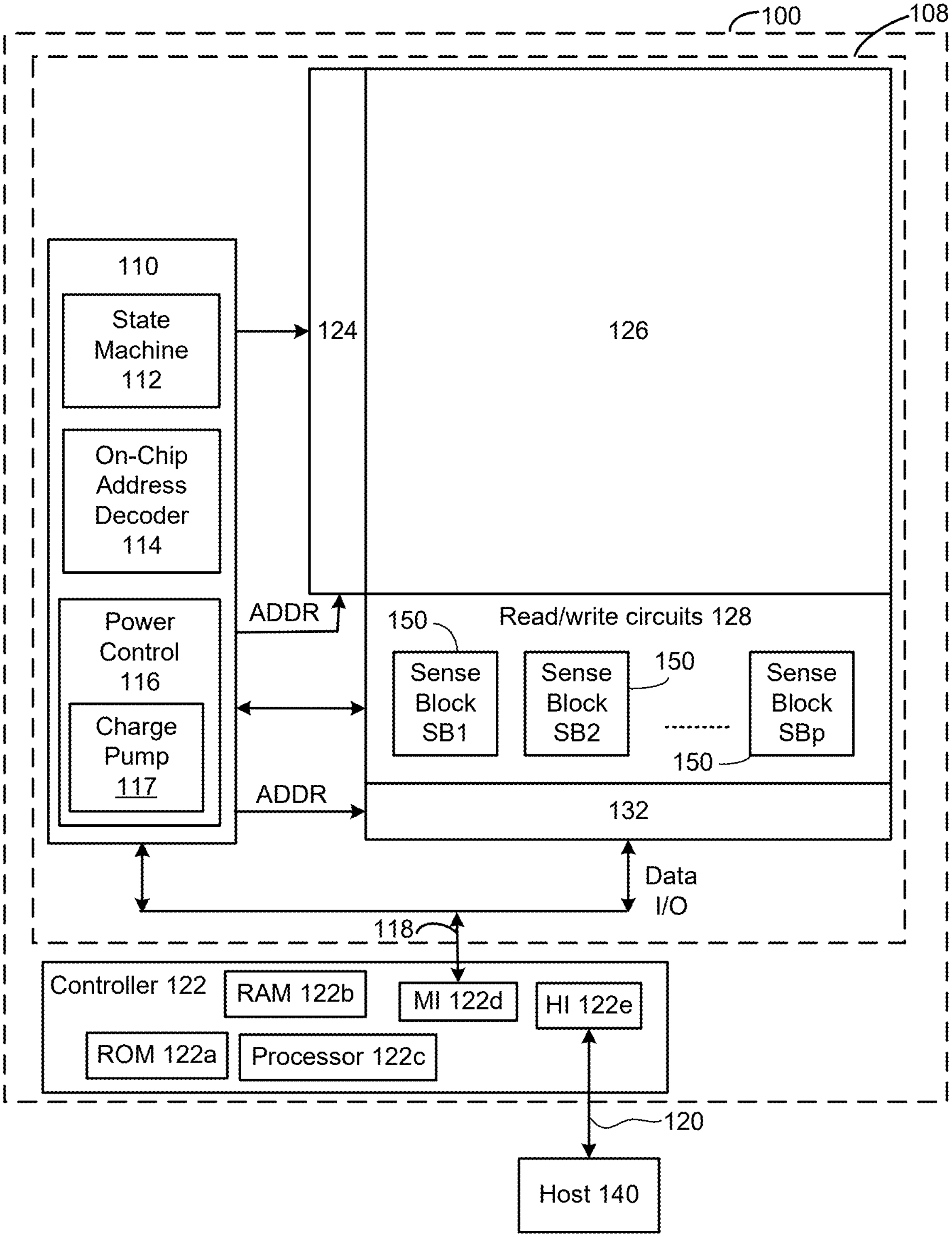
FIG. 1 is a functional block diagram of a memory device.
Figure 2A:
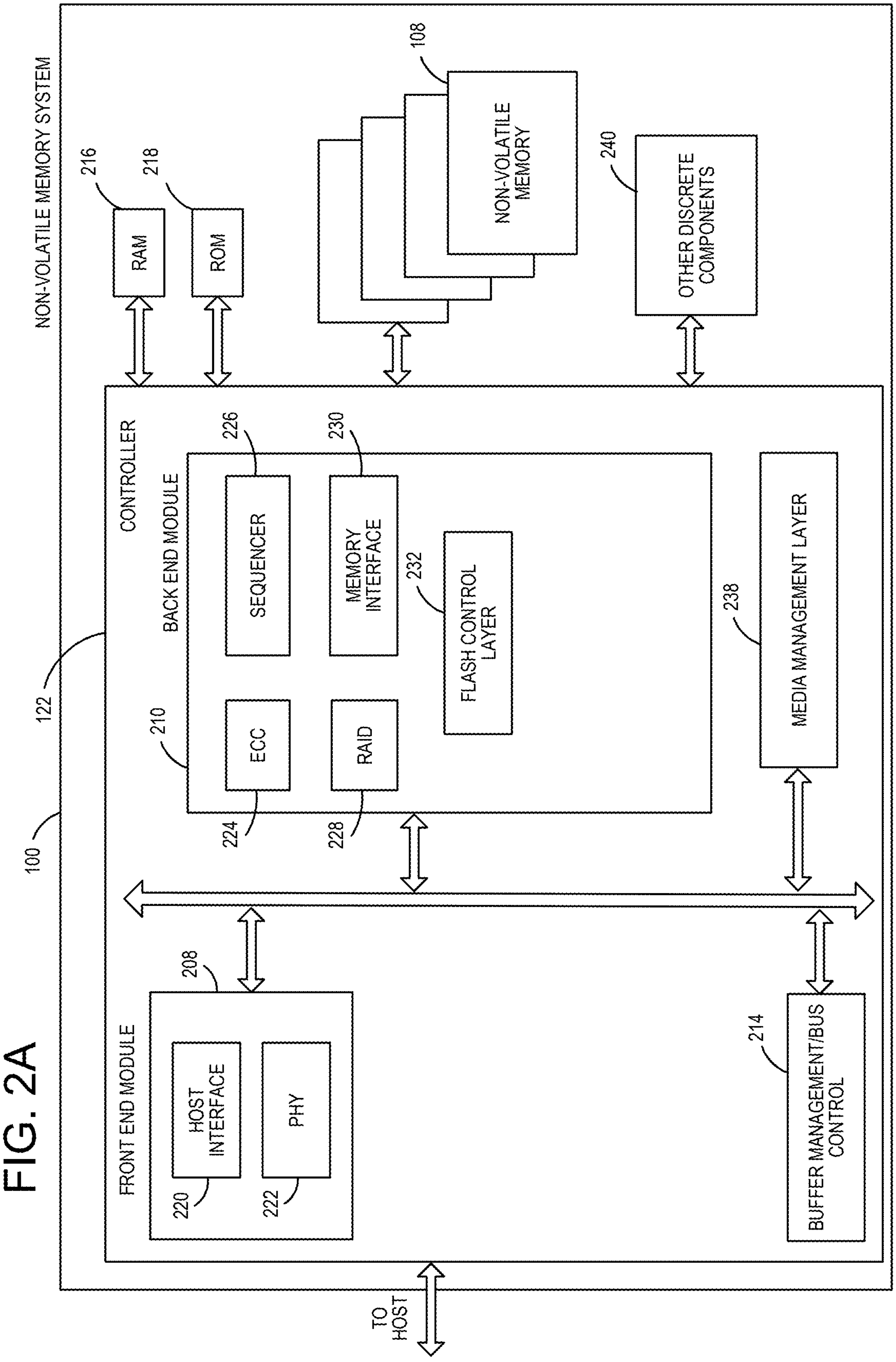
FIGS. 2A-B are block diagrams depicting embodiments of a memory system.
Figure 2B:
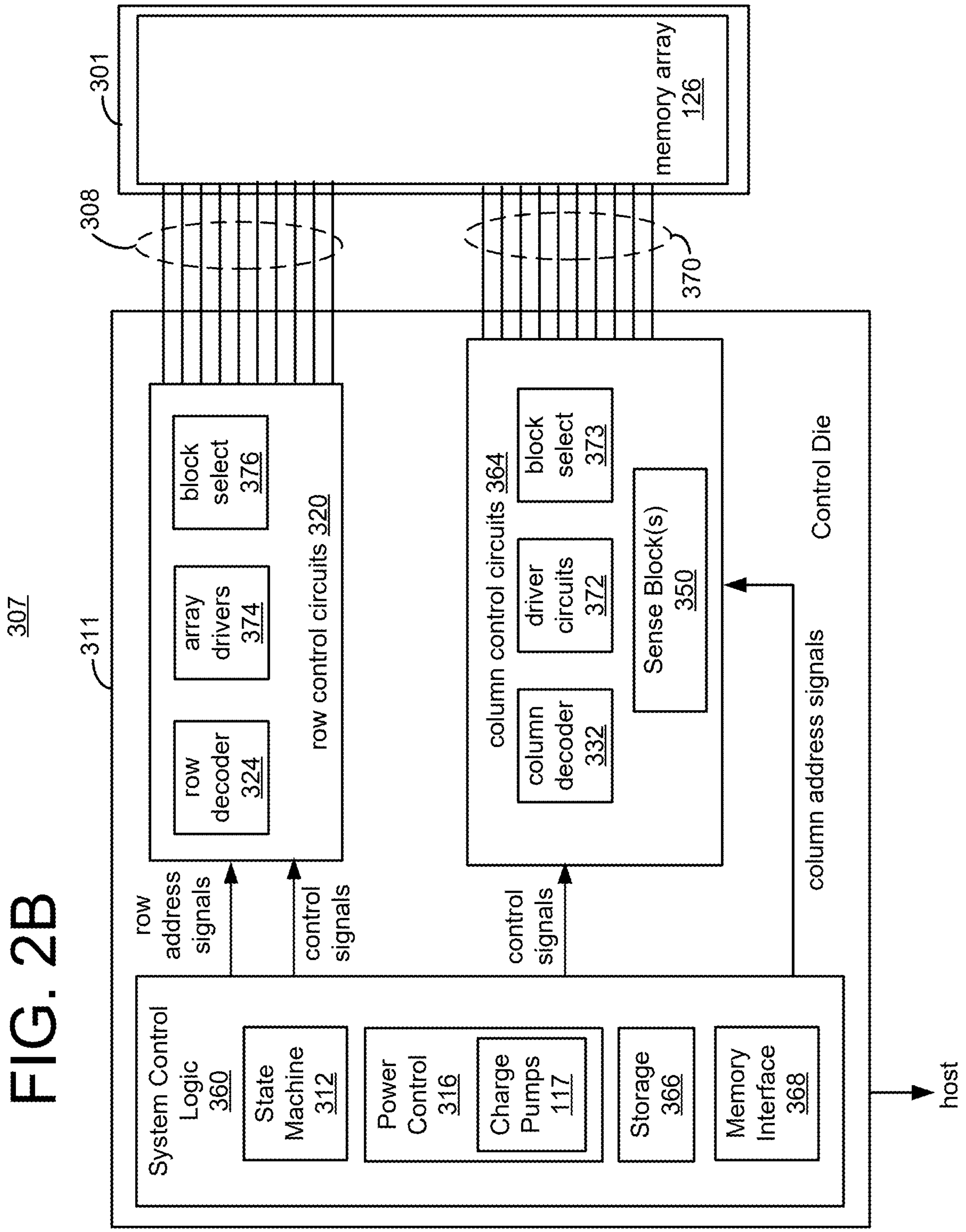
Figure 3:
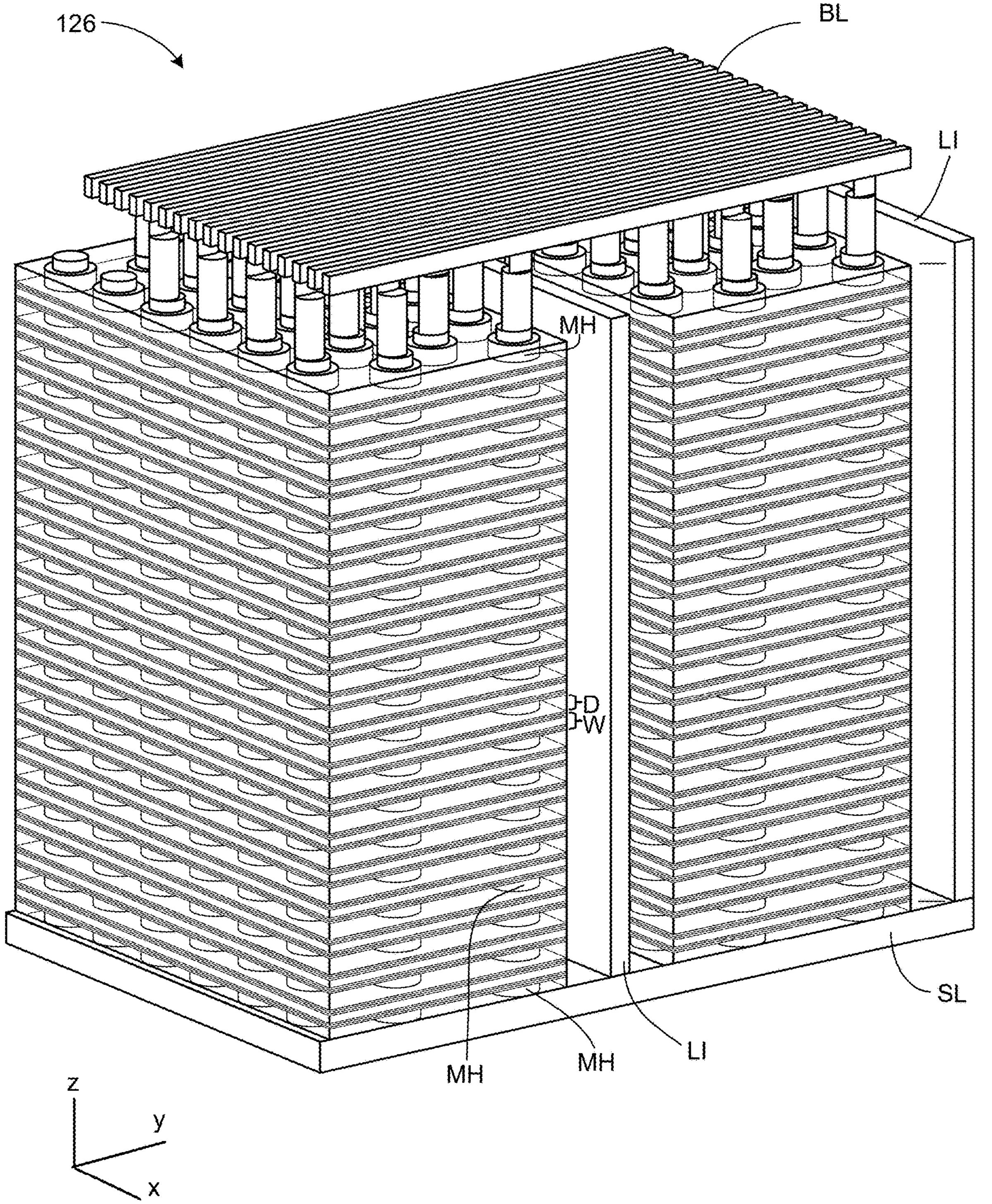
FIG. 3 is a perspective view of a portion of one embodiment of a monolithic three dimensional memory structure.

FIGS. 1-3 describe examples of memory systems that can be used to implement the technology proposed herein. FIG. 1 is a functional block diagram of an example memory system 100. The components depicted in FIG. 1 are electrical circuits. Memory system 100 includes one or more memory die 108. The one or more memory dies 108 can be complete memory dies or partial memory dies. In one embodiment, each memory die 108 includes a memory structure 126, control circuit 110, and read/write circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuits) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuit 110 cooperates with the read/write circuits 128 to perform memory operations (e.g., write, read, erase and others) on memory structure 126, and includes state machine 112, an on-chip address decoder 114, and a power control circuit 116. In one embodiment, control circuit 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 includes charge pumps 117 for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs various functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122*c*, ROM 122*a*, RAM 122*b*, a memory interface (MI) 122*d* and a host interface (HI) 122*e*, all of which are interconnected. The storage devices (ROM 122*a*, RAM 122*b*) store code (software) such as a set of instructions (including firmware), and one or more processors 122*c* is/are operable to execute the set of instructions to provide the functionality described herein. Alternatively, or additionally, one or more processors 122*c* can access code from a storage device in the memory structure, such as a reserved area of memory cells connected to one or more word lines. RAM 122*b* can be to store data for controller 122, including caching program data (discussed below). Memory interface 122*d*, in communication with ROM 122*a*, RAM 122*b* and processor 122*c*, is an electrical circuit that provides an electrical interface between controller 122 and one or more memory die 108. For example, memory interface 122*d* can change the format or timing of signals, provide a buffer, isolate from surges, latch I/O, etc. One or more processors 122*c* can issue commands to control circuit 110 (or another component of memory die 108) via Memory interface 122*d*. Host interface 122*e* provides an electrical interface with host 140 data bus 120 in order to receive commands, addresses and/or data from host 140 to provide data and/or status to host 140.

In one embodiment, memory structure 126 comprises a three-dimensional memory array of nonvolatile memory cells in which multiple memory levels are formed above a single substrate, such as a wafer. The memory structure may comprise any type of nonvolatile memory that are monolithically formed in one or more physical levels of arrays of memory cells having an active area disposed above a silicon (or other type of) substrate. In one example, the nonvolatile memory cells comprise vertical NAND strings with charge-trapping material.

In another embodiment, memory structure 126 comprises a two-dimensional memory array of nonvolatile memory cells. In one example, the nonvolatile memory cells are NAND flash memory cells utilizing floating gates. Other types of memory cells (e.g., NOR-type flash memory) can also be used. The exact type of memory array architecture or memory cell included in memory structure 126 is not limited to the examples above.

FIG. 2A is a block diagram of example memory system 100, depicting more details of one embodiment of controller 122. The controller in FIG. 2A is a flash memory controller but note that the nonvolatile memory die 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and nonvolatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, memory system 100 includes a single channel between controller 122 and nonvolatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2A, controller 122 includes a front end module 208 that interfaces with a host, a back end module 210 that interfaces with the one or more nonvolatile memory die 108, and various other modules that perform functions which will now be described in detail.

The components of controller 122 depicted in FIG. 2A may take the form of a packaged functional hardware unit (e.g., an electrical circuit) designed for use with other components, a portion of a program code (e.g., software or firmware) executable by a (micro) processor or processing circuits that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2A is one example implementation that may (or may not) use the components of controller 122 depicted in FIG. 1 (i.e., RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2A as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host and decodes and error corrects the data bytes read from the nonvolatile memory. A command sequencer 226 generates command sequences, such as program and erase command sequences, to be transmitted to nonvolatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g., as an extra plane, or extra block, or extra WLs within a block. A memory interface 230 provides the command sequences to nonvolatile memory die 108 and receives status information from nonvolatile memory die 108. In one embodiment, memory interface 230 may be a double data rate (DDR) interface, such as a Toggle Mode 200, 400, or 800 interface. A flash control layer 232 controls the overall operation of back end module 210.

Additional components of memory system 100 illustrated in FIG. 2A include media management layer 238, which performs wear leveling of memory cells of nonvolatile memory die 108. Memory system 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126 of memory die 108. The MML 238 may be needed because: 1) the memory may have limited endurance; 2) the memory structure 126 may only be written in multiples of pages; and/or 3) the memory structure 126 may not be written unless it is erased as a block (or a tier within a block in some embodiments). The MML 238 understands these potential limitations of the memory structure 126 which may not be visible to the host. Accordingly, the MML 238 attempts to translate the writes from host into writes into the memory structure 126.

Controller 122 may interface with one or more memory die 108. In one embodiment, controller 122 and multiple memory dies (together comprising memory system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a nonvolatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

In one embodiment, the control circuit(s) (e.g., control circuits 110) are formed on a first die, referred to as a control die, and the memory array (e.g., memory structure 126) is formed on a second die, referred to as a memory die. For example, some or all control circuits (e.g., control circuit 110, row decoder 124, column decoder 132, and read/write circuits 128) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package in memory system 100. The integrated memory assembly 307 includes two types of semiconductor die (or more succinctly, "die"). Memory die 301 includes memory structure 126

Control die 311 includes column control circuits 364, row control circuits 320 and system control logic 360 (including state machine 312, power control module 316 (including charge pumps 117), storage 366, and memory interface 368). In some embodiments, control die 311 is configured to connect to the memory array 126 in the memory die 301. FIG. 2B shows an example of the peripheral circuits, including control circuits, formed in a peripheral circuit or control die 311 coupled to memory array 126 formed in memory die 301. System control logic 360, row control circuits 320, and column control circuits 364 are located in control die 311. In some embodiments, all or a portion of the column control circuits 364 and all or a portion of the row control circuits 320 are located on the memory die 301. In some embodiments, some of the circuits in the system control logic 360 is located on the on the memory die 301.

System control logic 360, row control circuits 320, and column control circuits 364 may be formed by a common process (e.g., CMOS process), so that adding elements and functionalities, such as ECC, more typically found on a memory controller 102 may require few or no additional process steps (i.e., the same process steps used to fabricate memory controller 102 may also be used to fabricate system control logic 360, row control circuits 320, and column control circuits 364). Thus, while moving such circuits from a die such as memory die 301 may reduce the number of steps needed to fabricate such a die, adding such circuits to a die such as control die 311 may not require many additional process steps.

FIG. 2B shows column control circuits 364 including sense block(s) 350 on the control die 311 coupled to memory array 126 on the memory die 301 through electrical paths 370. For example, electrical paths 370 may provide electrical connection between column decoder 332, driver circuits 372, and block select 373 and bit lines of memory array (or memory structure) 126. Electrical paths may extend from column control circuits 364 in control die 311 through pads on control die 311 that are bonded to corresponding pads of the memory die 301, which are connected to bit lines of memory structure 126. Each bit line of memory structure 126 may have a corresponding electrical path in electrical paths 370, including a pair of bond pads, which connects to column control circuits 364. Similarly, row control circuits 320, including row decoder 324, array drivers 374, and block select 376 are coupled to memory array 126 through electrical paths 308. Each of electrical path 308 may correspond to a word line, dummy word line, or select gate line. Additional electrical paths may also be provided between control die 311 and memory die 301.

In some embodiments, there is more than one control die 311 and/or more than one memory die 301 in an integrated memory assembly 307. In some embodiments, the integrated memory assembly 307 includes a stack of multiple control die 311 and multiple memory dies 301. In some embodiments, each control die 311 is affixed (e.g., bonded) to at least one of the memory dies 301.

The exact type of memory array architecture or memory cell included in memory structure 126 is not limited to the examples above. Many different types of memory array architectures or memory cell technologies can be used to form memory structure 126. No particular nonvolatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a perspective view of a portion of one example embodiment of a monolithic three dimensional memory array that can comprise memory structure 126, which includes a plurality nonvolatile memory cells. For example, FIG. 3 shows a portion of one block of memory. The structure depicted includes a set of bit lines BL positioned above a stack of alternating layers of dielectric material and conductive material on a substrate. For example, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. Data word line layers have data memory cells. Dummy word line layers have dummy memory cells. As will be explained below, the alternating dielectric layers and conductive layers are divided into "fingers" in regions that are separated by local interconnects LI. FIG. 3 shows two regions, each with respective NAND strings, and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data.

Figure 4:
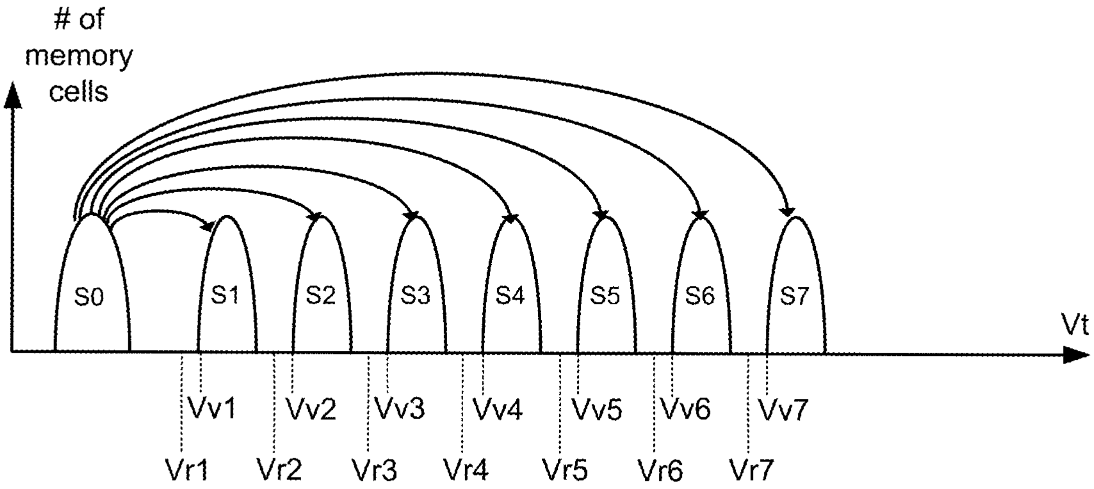
FIG. 4 illustrates aspects of programming operations according to an example.

FIG. 4 shows threshold voltage distributions for eight data states, S0 to S7, corresponding to three bits of data per cell (Three Level Cell, or TLC). Also shown are seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. The data states of multiple memory cells may be determined in parallel in a read operation.

FIG. 4 also shows seven verify reference voltages, Vv1, Vv2, Vv3, Vv4, Vv5, Vv6, and Vv7 used in read verify steps during a programming operation. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

Figure 5:
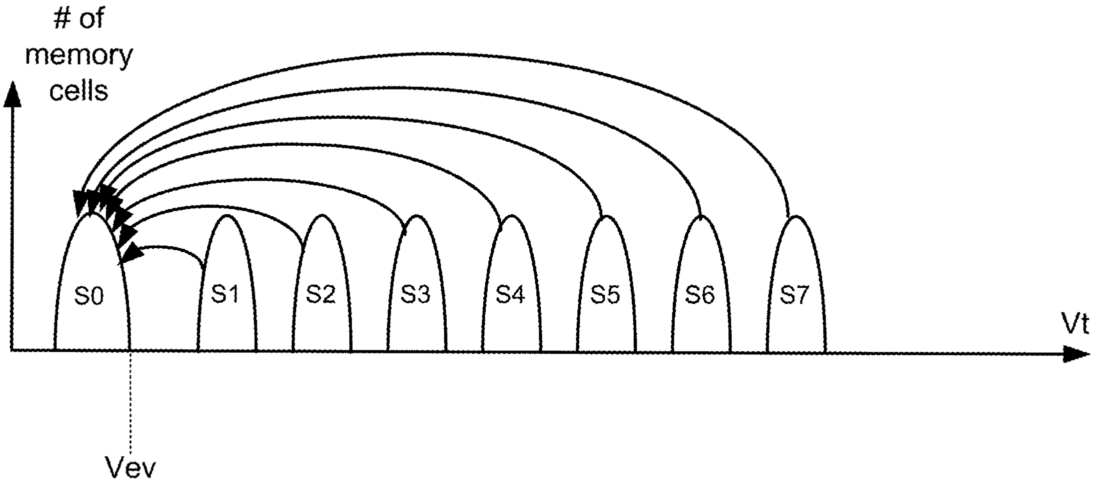
FIG. 5 illustrates aspects of erasing operations according to an example.

In general, during sensing of verify and read operations, the selected word line is connected to a voltage (one example of a reference signal or read voltage), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5A) in order to sense whether a threshold voltage of the concerned memory cell has reached such level. After applying the read voltage to the word line, the conduction current of the memory cell is measured to determine whether the memory cell turned on (conducted current) in response to the voltage applied to the word line. If the conduction current is measured to be greater than a certain value (e.g., Isense), then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected data memory cells are provided with one or more read pass voltages (also referred to as bypass voltages) at their control gates so that these data memory cells will operate as pass gates (e.g., conducting current regardless of whether they are programmed or erased), select gates of selected NAND strings are provided with sufficient voltage (e.g., select voltages via select lines) to make corresponding select transistors conductive ("turn on") and dummy memory cells of selected NAND strings are provided with sufficient voltage (e.g., dummy word line voltage via dummy word lines) to make corresponding dummy memory cells conductive.

FIG. 5 shows an example of an erase operation in which charge is removed from memory cells of threshold voltage distributions for seven data states, S1 to S7, which results in all programmed memory cells being in erased state S0. Also shown is erase verify voltage, Vev for verifying memory cells are in state S0. In an example, a high voltage (erase voltage) is applied to word lines of a block to erase memory cells. For example, 20 volts may be used as an erase voltage while lower voltages may be used to program and read memory cells. Programming memory cells may use voltage pulses of different voltages and reading may apply different read voltages and read pass voltages to word lines. Additional voltages may be applied to dummy word lines, select lines and other components. Thus, a range of voltages may be used in various memory access operations (read, write and erase) directed to memory cells. In general, such voltages are not all directly supplied to a memory die (e.g., memory die 108) or control die (e.g., control die 311) and may be generated on-chip. For example, memory die 108 may receive a supply voltage (e.g., 1.8 volts or 3.0 volts) and may generate different voltages (e.g., erase voltage, read voltages, program voltages) from the supply voltage using appropriate power circuits. An example of a circuit that may be used to generate a relatively high voltage (e.g., erase voltage) from a lower supply voltage is a charge pump. A charge pump can use a capacitor to transfer charge from an input node to an output node.

Figure 6:
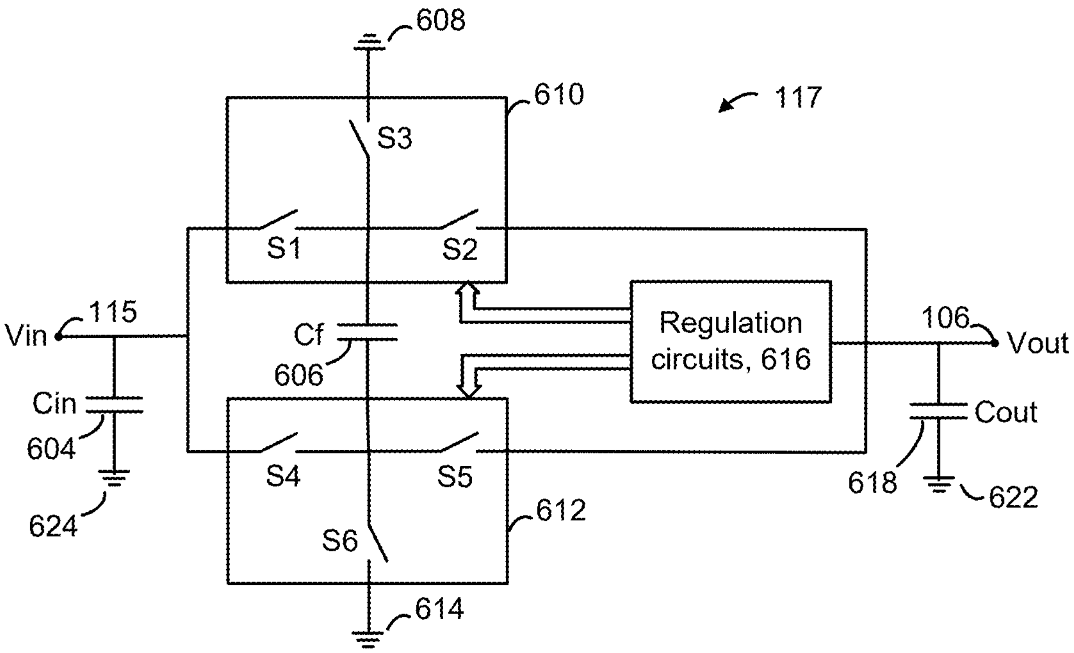
FIG. 6 depicts an example implementation of a charge pump.

FIG. 6 depicts an example implementation of the charge pump 117 configured as a single-stage charge pump. A charge pump generally refers to a switching voltage converter that employs an intermediate capacitive storage element which is sometimes referred to as a flying capacitor or a charge transfer capacitor. One or more capacitors can be used. Moreover, a charge pump can include multiple stages connected in series to obtain special features such as a high output voltage and a greater range of output voltages. A charge pump can be constructed or configured for providing voltage conversion for applications including: multiplier, divider, inverter and follower. The charge pump 117 is a generalized embodiment which can be controlled for multiplier, divider, inverter and follower applications. The charge pump 117 includes an input node 115 at which an input voltage (Vin) is applied. For example, Vin may be equal to a fixed power supply voltage sometimes referred to as Vdd or Vcc in a semiconductor chip. Or, Vin may be a clamped voltage which is lower than the power supply voltage. Charge from the voltage is maintained in an input capacitor Cin 604 which is connected to a ground node 624.

A first set of switches 610 and a second set of switches 612 are controlled by regulation circuits 616 to transfer charge from the input node 115 to a capacitor Cf 606, and from Cf 606 to an output node 106. Vout is a resulting voltage at the output node 106 and can be greater than or less than Vin. The output node is coupled to an output capacitor Cout 618, which is connected to a ground node 622. The first set of switches 610 includes switches S1, S2 and S3 which are star-connected to one terminal (such as the top conductor) of Cf. The switches may be MOSFETs, bipolar junction transistors, relay switches, or the like. S1 connects the top conductor of Cf 606 to the input node 115 to receive a charge from Vin. S2 connects the top conductor of Cf 606 to the output node 106 to transfer its charge to the output node. S3 connects the top conductor of Cf 606 to a ground node 608. Similarly, the second set of switches 612 includes switches S4, S5 and S6 which are star-connected to another terminal (such as the bottom conductor) of Cf 606. S4 connects the bottom conductor of Cf 606 to the input node 115 to receive a charge from Vin. S5 connects the bottom conductor of Cf 606 to the output node 106 to transfer its charge to the output node. S6 connects the bottom conductor of Cf 606 to a ground node 614.

Successful memory access operations may depend on using adequate memory access voltages (e.g., memory access voltages that are outside of a specified range may give results that are unacceptable such as a high error rate, unrecoverable data, slow time to complete memory access operations, failure to complete memory access operations and/or other negative effects). Testing may be performed in order to ensure that memory access voltages are adequate. For example, testing may be performed prior to sale of a data storage system (e.g., factory testing) and systems failing such testing may be designated as bad and may be discarded. Testing may be performed on dies prior to assembly of a data storage system and dies that do not meet particular criteria may be designated as bad and may be discarded or may be binned according to their characteristics. In some cases, a portion of a memory structure in a die may be discarded as a result of testing (e.g., factory testing or later testing subsequent to sale and use). For example, if an adequate memory access voltage is not available for a portion of a memory structure, that portion of the memory structure may be designated as bad and may be discarded (e.g., not subsequently used to store data). Testing may be performed after some period of use in some cases (e.g., to confirm that voltages remain in specified ranges). Such testing may be performed periodically and/or in response to a triggering event (e.g., high error rate, excessive time to read, write or erase or other event).

Figure 7A:
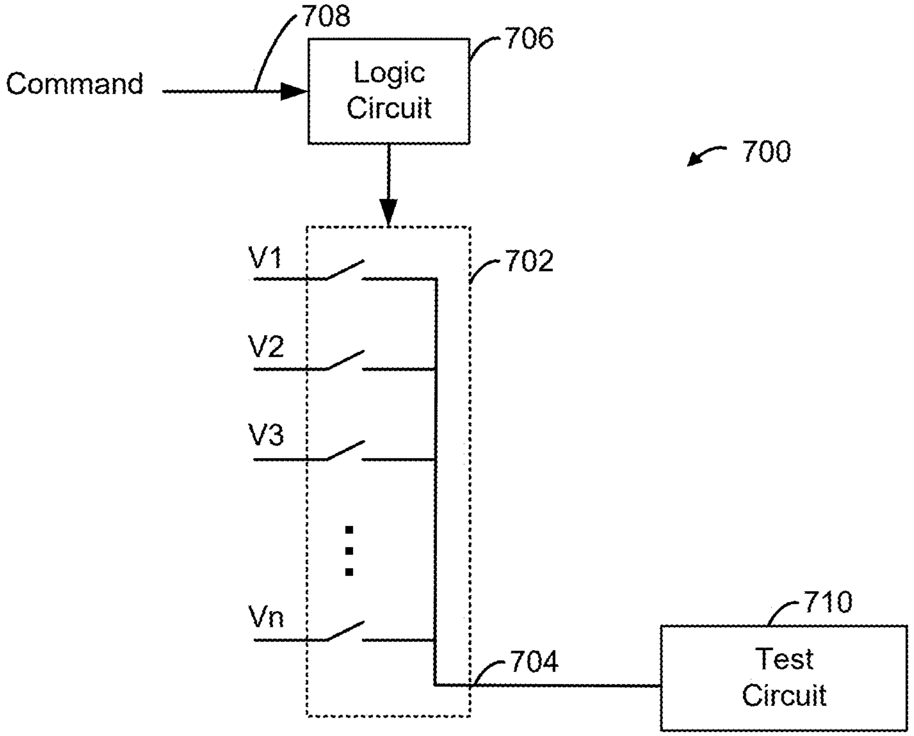
FIGS. 7A-B illustrate an example of circuits for testing memory access voltages.

Testing memory access voltages may be performed in various ways. FIG. 7A illustrates an example of a circuit 700 that may be used to implement testing of memory access voltages V1, V2, V3 . . . . Vn. Circuit 700 includes selection switches 702, which receive memory access voltages V1-Vn on dedicated inputs and provides a selected one of memory access voltages V1-Vn as an output voltage at output terminal 704. For example, selection switches 702 may include a switch for each input terminal (terminals receiving V1 to Vn) to enable one such input terminal to be electrically connected to output terminal 704 at a time so that one memory access voltage V1-Vn can be provided as an output voltage. Logic circuit 706 is connected to selection switches 702 and controls selection switches 702 (e.g., to cause a selected switch to close in order to select an individual memory access voltage as an output). Logic circuit 706 has command input 708, which receives commands (e.g., from an external circuit) and may configure selection switches 702 in response to commands. Output terminal 704 is connected to test circuit 710, which receives a voltage from output terminal 704 (e.g., whichever one of voltages V1 to Vn is selected). Test circuit 710 may be an external test circuit that is connected to receive a selected voltage and perform one or more test (e.g., to determine if the selected voltage meets a specification).

In an example of operation of circuit 700, volage testing is carried out by sequentially testing voltages V1 to Vn one-by-one in response to corresponding commands. For example, an individual voltage may be tested by sending a corresponding command or commands to command input 708, which causes logic circuit 706 to control selection switches 702 to send the selected memory access voltage to test circuit 710. After a command is sent, a memory die may remain busy while testing is performed and may assert a busy signal. Subsequently, when the command has been executed (e.g., after testing of memory access voltage V1) and testing of the specified voltage is complete, a ready signal may be asserted and a subsequent command may be sent (e.g., specifying memory access voltage V2).

Figure 7B:
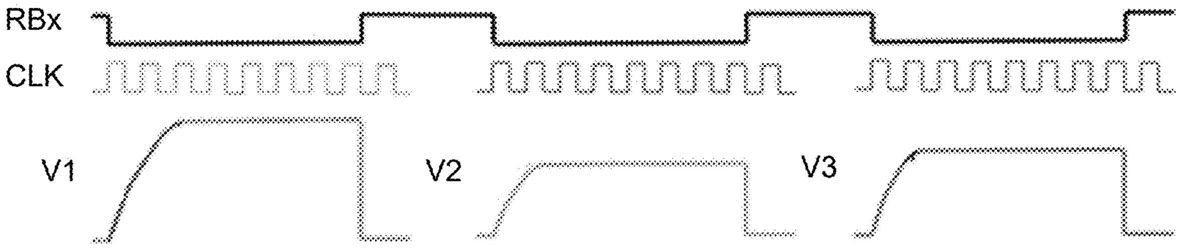

FIG. 7B shows an example of such an operation (e.g., implemented by circuit 700), including a Ready/Busy signal, RBx, a clock signal, CLK, and three different memory access voltages that are tested, V1, V2 and V3. Testing of each memory access voltage, V1-V3, may take significant time and when testing of an individual memory access voltage is completed, there may be some significant delay before starting testing of a subsequent memory access voltage because a subsequent command to perform the testing is only sent after RBx indicates that the die is ready.

In some cases, proceeding through all memory access voltages in this manner may be time consuming (e.g., there may be a large number of such voltages for each memory access operation such as read, write and erase). Such voltage testing may require a significant amount of time, which may add cost.

Figure 8A:
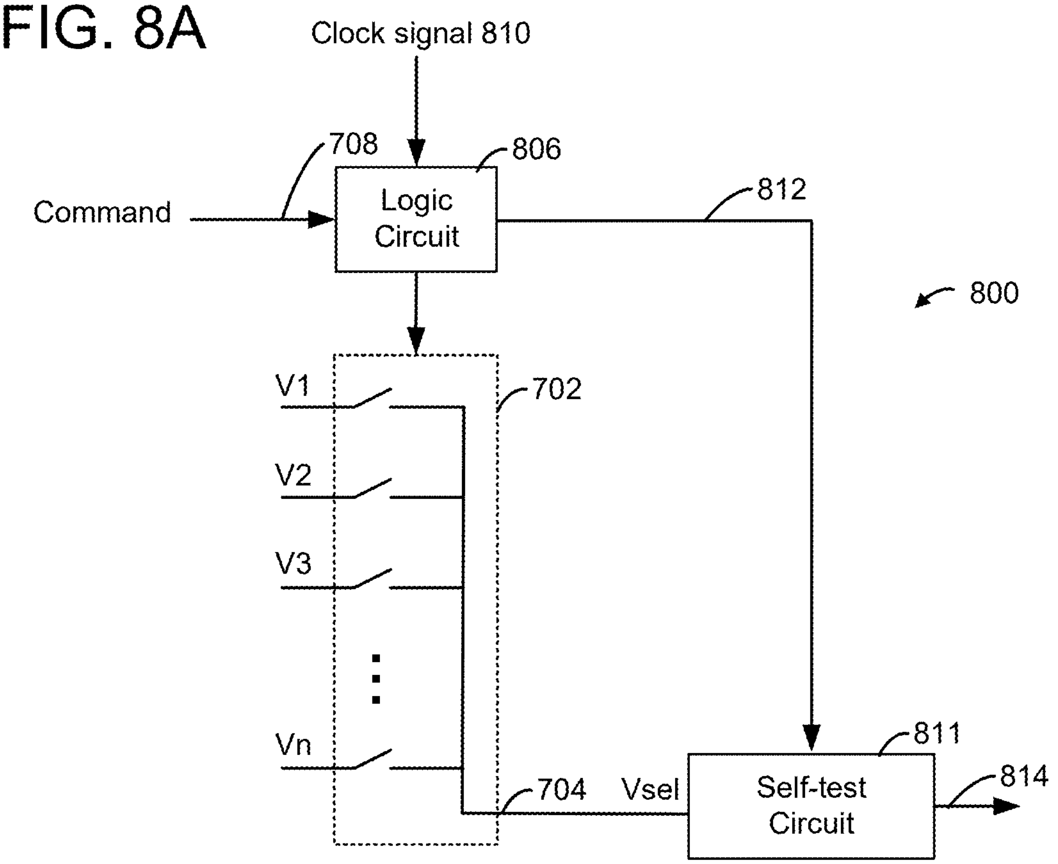
FIGS. 8A-C illustrate an example of circuits including a self-test circuit for testing memory access voltages.

Aspects of the present technology are directed to improved methods of testing memory access voltages (e.g., faster than the example above). For example, FIG. 8A shows an example of control circuits 800 that are configured to receive a clock signal 810 in addition to memory access voltages V1 to Vn. Logic circuit 806 is configured to control selection switches 702 according to clock signal 810 so that a different voltage (from V1 to Vn) is selected during each clock pulse. Logic circuit 806 is also connected to self-test circuit 811 by connection 812. Self-test circuit 811 may be located on the same die as selection switches 702 and logic circuit 806. Logic circuit 806 may cause self-test circuit 811 to perform appropriate testing during each clock pulse (e.g., to perform first testing for voltage V1, second testing for voltage V2 and so on) to determine whether a selected voltage (Vsel) meets requirements (e.g., whether each voltage V1 to Vn meets respective requirements). For example, a minimum or lower limit may be set for each voltage V1 to Vn. Logic circuit 806 may control selection switches 702 to select a particular memory access voltage, Vsel (e.g., Vsel=Vx, where x may be any value from 1 to n) and may cause self-test circuit 811 to compare Vx with a reference Vx_ref (e.g., a minimum or limit) to ensure that Vx is above Vx_ref. Self-test circuit 810 has an output 814, which may provide one or more test result (e.g., a pass/fail result, an indication as to which voltage(s) failed and/or what voltages were obtained). Control circuit 800 may be considered an example of means for selecting a different memory access voltage of a plurality of memory access voltages during each clock pulse and for each memory access voltage, determining whether the memory access voltage exceeds a corresponding voltage limit.

Figure 8B:
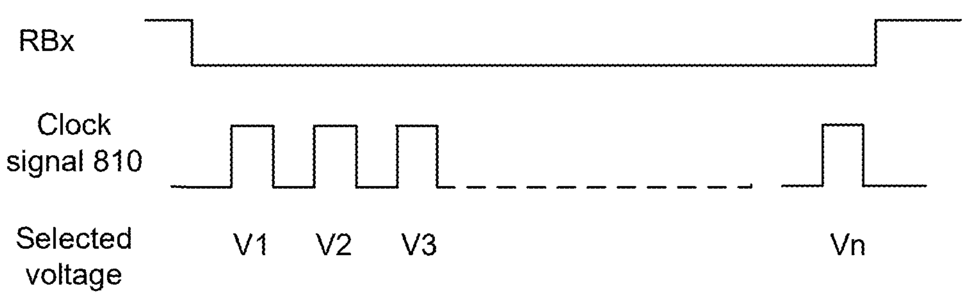

FIG. 8B illustrates an example of operation of control circuits 800 including a Ready/Busy signal, RBx, and clock signal 810, which includes multiple clock pulses. Also shown are selected voltages, V1 to Vn, which are selected according to pulses of clock signal 810. For example, voltage V1 is selected during a first clock pulse of clock signal 810 (e.g., sent to self-test circuit 811), voltage V2 is selected during a second clock pulse of clock signal 810, voltage V3 is selected during a third clock pulse of clock signal 810 and so on to voltage Vn, which is selected during a last clock pulse. The selected memory access voltages V1 to Vn may be sent from output terminal 704 to self-test circuit 811 during sequential clock pulses (e.g., one voltage per clock pulse as shown). By selecting a different memory access voltage at each clock pulse, selection may be performed without separate commands and wait times that may be associated with communication of such commands.

Figure 8C:
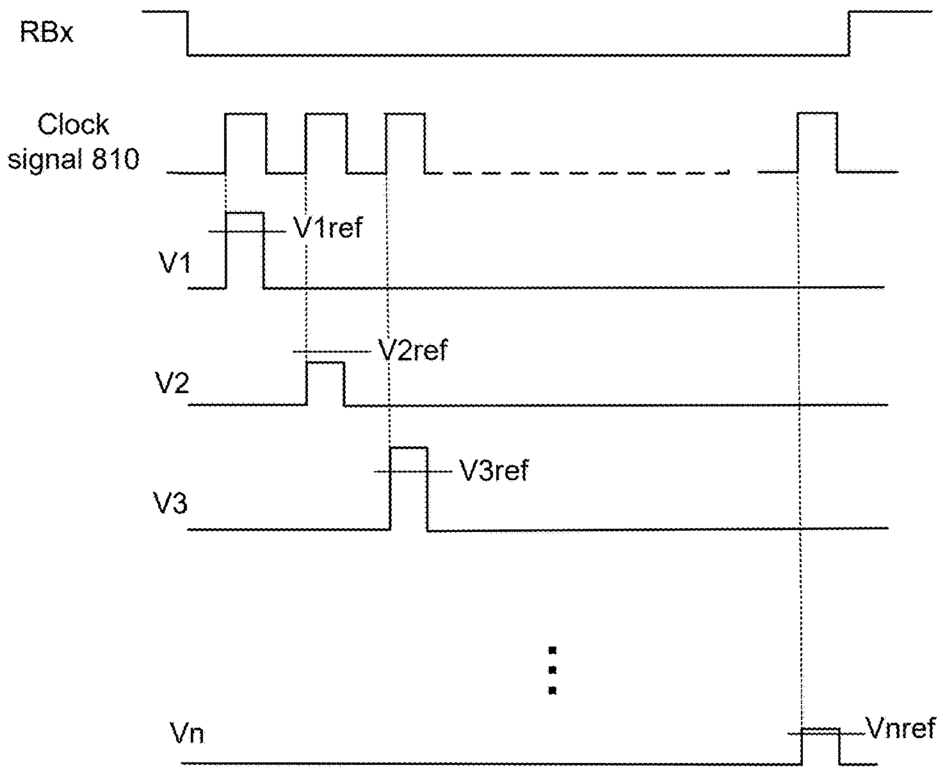

FIG. 8C illustrates an example of operation of self-test circuit 811, which receives samples of voltages V1 to Vn during successive clock pulses of clock signal 810 and performs corresponding testing. For example, each sampled voltage may be compared with a corresponding reference, which in the example shown is a minimum voltage or lower limit so that if a voltage received from output terminal 704 exceeds the corresponding reference voltage then the voltage is considered to meet a specification (e.g., the voltage passes testing and may be considered a non-defective voltage) and if a voltage does not exceed the corresponding reference voltage then it is not considered to meet the specification (e.g., the voltage fails testing and may be considered a defective voltage). FIG. 8C shows a sample of voltage V1 output during the first clock pulse and compared with a first reference voltage, V1ref. The sample of voltage V1 exceeds V1ref so that voltage V1 passes this test. Voltage V2 is output during the second clock pulse and is compared with a second reference voltage, V2ref. The sample of voltage V2 does not exceed V2ref so that voltage V2 does not pass this test (e.g., fails test). Voltage V3 is output during the third clock pulse and is compared with a third reference voltage, V3ref. The sample of voltage V3 exceeds V3ref so that voltage V3 passes this test. Voltage Vn is output during the nth clock pulse and is compared with an nth reference voltage, Vnref. The sample of voltage Vn exceeds Vnref so that voltage Vn passes this test.

Figure 9:
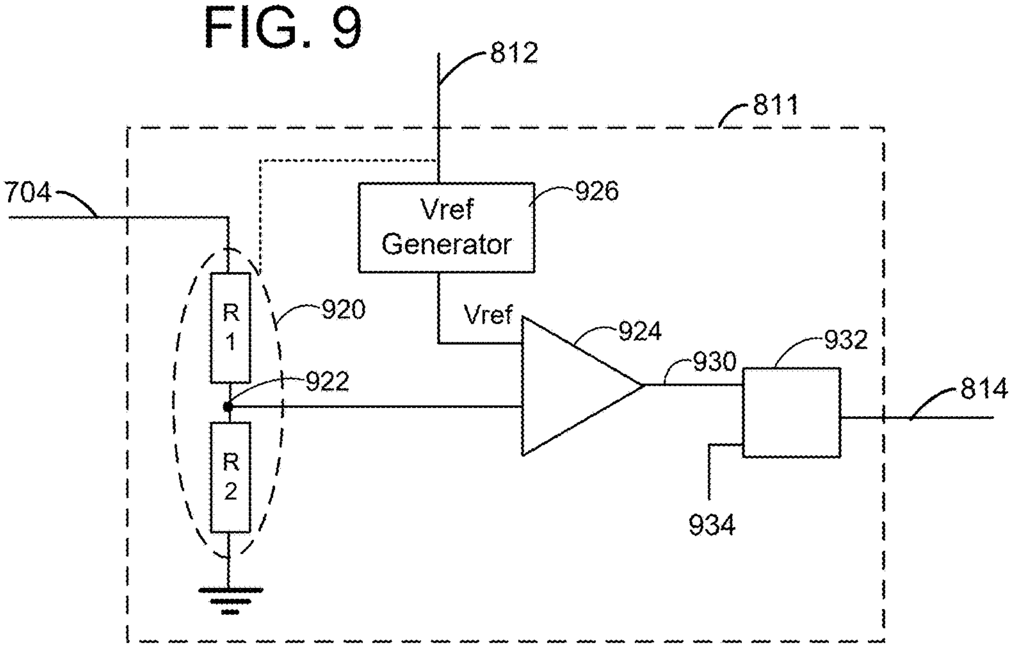
FIG. 9 illustrates an example of a self-test circuit.

FIG. 9 illustrates an example implementation of self-test circuit 811. Terminal 704 (output terminal of circuit 700) is connected to a voltage divider 920 in this example, with an output from node 922 of voltage divider 920 connected as a first input to comparator 924. A second input (Vref) of comparator 924 is provided by a reference voltage generator, Vref generator 926, which receives a signal via connection 812 from logic circuit 806 (e.g., a control signal that causes Vref generator 926 to generate an appropriate reference voltage for testing a selected voltage provided at terminal 704.

Voltage divider 920 (resistive divider) is formed of resistors R1 and R2, which are connected in series between terminal 704 and ground so that the voltage output from node 922 is some fraction of the voltage at terminal 704 (e.g., a predetermined fraction of Vsel). The reference voltage, Vref, may be a similar fraction of a specified limit (e.g., minimum) for a voltage at terminal 704. Thus, instead of directly comparing voltage at terminal 704 with a reference voltage (e.g., as illustrated in FIG. 8C), a stepped-down voltage from terminal 704 is compared with a similarly stepped-down reference voltage (e.g., V1/x may be compared with V1ref/x).

Comparator 924 provides comparator output 930 to a latch 932, which provides an output (e.g., logical output) of self-test circuit 811 at output terminal 814. A latch enable input 934 is provided to latch 932. Latch enable input 934 may be used to latch or sample an output of comparator 924 at an appropriate time and provide the output at output terminal 814 (e.g., as a logical output indicating if a test is a pass or fail).

Figure 10A:
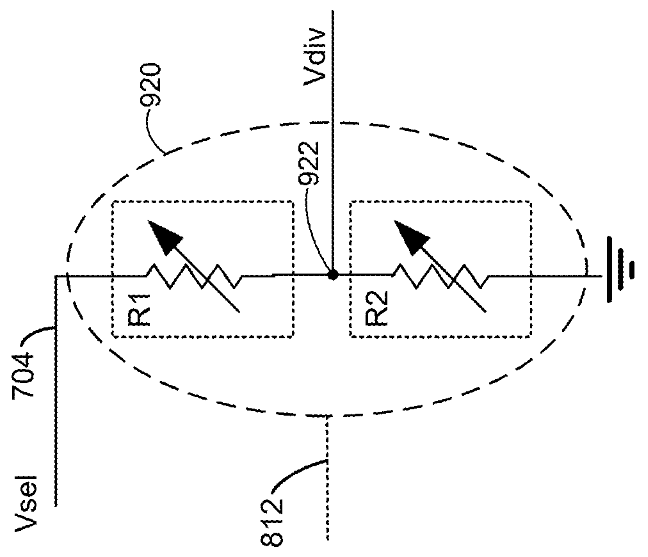
FIGS. 10A-C illustrate an example of a voltage divider of a self-test circuit.

FIG. 10A illustrates an example implementation of voltage divider 920 in which the resistors, R1 and R2, are formed by variable resistors, which allows the output voltage at node 922 to be configured (e.g., set to a configurable fraction of a voltage at terminal 704). By configuring R1 and R2 appropriately, a range of different voltage outputs may be provided at node 922 and to comparator 924. For example, resistances R1 and R2 may be differently configured for different voltages at terminal 704 (e.g., for V1 to Vn), which may allow comparison of different voltages (e.g., instead of, or in addition to changing Vref for different voltages at terminal 704). Resistances R1 and R2 may be configured by signals from connection 812 (e.g., configured by logic circuit 706 according to the selected voltage V1-Vn).

Figure 10B:
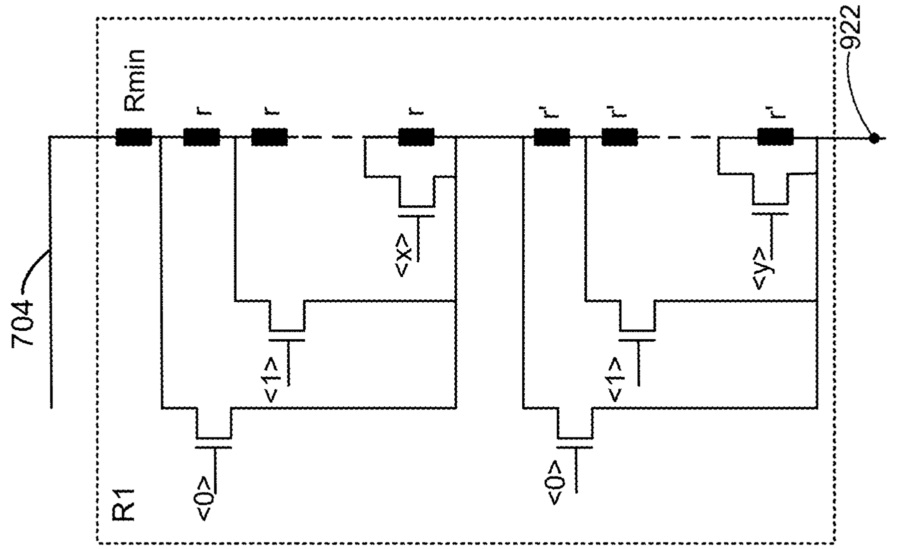

FIG. 10B shows an example implementation of variable resistor R1, which includes multiple resistors connected in series between terminal 704 and node 922 with switches configured to bypass a configurable number of resistors. Terminal 704 is connected to a resistor that has a fixed resistance, Rmin, which represents the minimum resistance of R1 (no bypass available for Rmin). For example, Rmin may be 180 kilo-ohms (kΩ) or some other value. An upper set of x resistors each of resistance r are provided for coarse adjustment of R1 with bypass connections controlled by signals marked <0> to <x> to allow from zero to x resistors of resistance r to be added in series (e.g., signal <0> causes no additional resistors to be added, signal <1> causes one additional signal to be added, signal <2> causes two additional resistors to be added and so on). The number of resistors in this section (x) may be any suitable number (e.g., ten, twenty or some other number) and the value of r may be 100 kilo-ohms or other suitable value. A lower set of y resistors of resistance r' are provided for fine adjustment of R1 with bypass connections controlled by signals marked <0> to <y> to allow from zero to y resistors of resistance r' to be added in series. The value of r' may be, for example, twenty kilo-ohms (20 k Ω) or some other value less than the value of r.

Figure 10C:
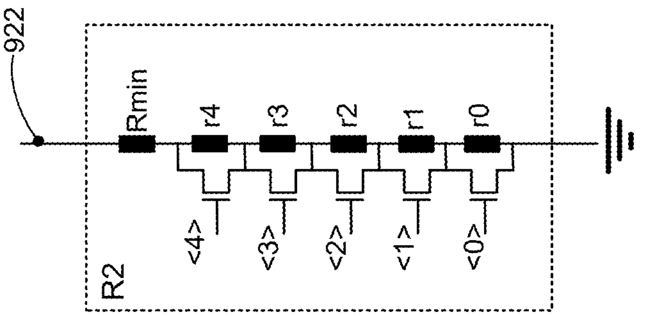

FIG. 10C shows an example implementation of variable resistor R2, which includes multiple resistors connected in series between node 922 and ground with switches configured to bypass a configurable number of resistors. Node 922 is connected to a resistor that has a fixed resistance, Rmin, which represents the minimum resistance of R2 (no bypass available for Rmin). For example, Rmin may be about 100 kilo-ohms (kΩ) or some other value. Five additional resistors of resistance r0 to r4 are provided for adjustment of R2 with bypass connections controlled by signals marked <0> to <4> respectively to allow any combination of resistors r0, r1, r2, r3 and r4 to be connected in series. The resistances of resistors r0, r1, r2, r3 and r4 may be the same or different. For example, different resistors may have different resistance values to allow a wide range of resistance for R2. In an example, r0=1 kilo-ohm, r1=2 kilo-ohm, r2=4 kilo-ohm, r3=8 kilo-ohm and r4=16 kilo-ohm. In an example, the resistance of R2 is configured in a one-time configuration and subsequent testing includes changing R1 according to the selected voltage to be tested (e.g., while maintaining Vref constant)

The voltage divider output or divided voltage (Vdiv) provided to comparator 924 from node 922 is depends on the selected voltage (Vsel) that is provided at terminal 704 and the values selected for R1 and R2 according to the formula:

$$Vdiv = Vsel * \left(\frac{R2}{R\min + R1 + R2}\right)$$

Using appropriate resistors may allow a wide range of voltages to be measured with a relatively high resolution (e.g., Vsel from 3 to 23 volts measured with resolution of 200 mV and from 1 to 3 volts with a resolution of 100 mV for a fixed Vref=1.2 volts). Values of R1 and R2 may be selected so that Vdiv is greater than Vref (e.g., comparator 924 outputs a high signal) if Vsel is above a minimum value and if Vdiv is less than Vref (e.g., comparator 924 outputs a low signal) then Vref is below the minimum value. For example, values of R1 and R2 may be configured so that for each Vsel, a corresponding values of Vdiv is a predetermined fraction of Vsel that can be compared with Vref to perform a pass/fail test. In this way, a wide range of voltages may be tested using the same reference voltage (Vref). For example, with Vref=1.2 volts, a voltage with a limit of 12 volts may be tested by setting R1 and R2 so that Vdiv=Vsel/10 while a voltage with a limit of 6 volts may be tested by setting R1 and R2 so that Vdiv=Vsel/5.

In an example, latch 932 may be formed by a two-stage synchronous register, which is used to ensure the stability and reliability of output terminal 814. The output can be stored in latch 932 (e.g., in log registers).

Figure 11:
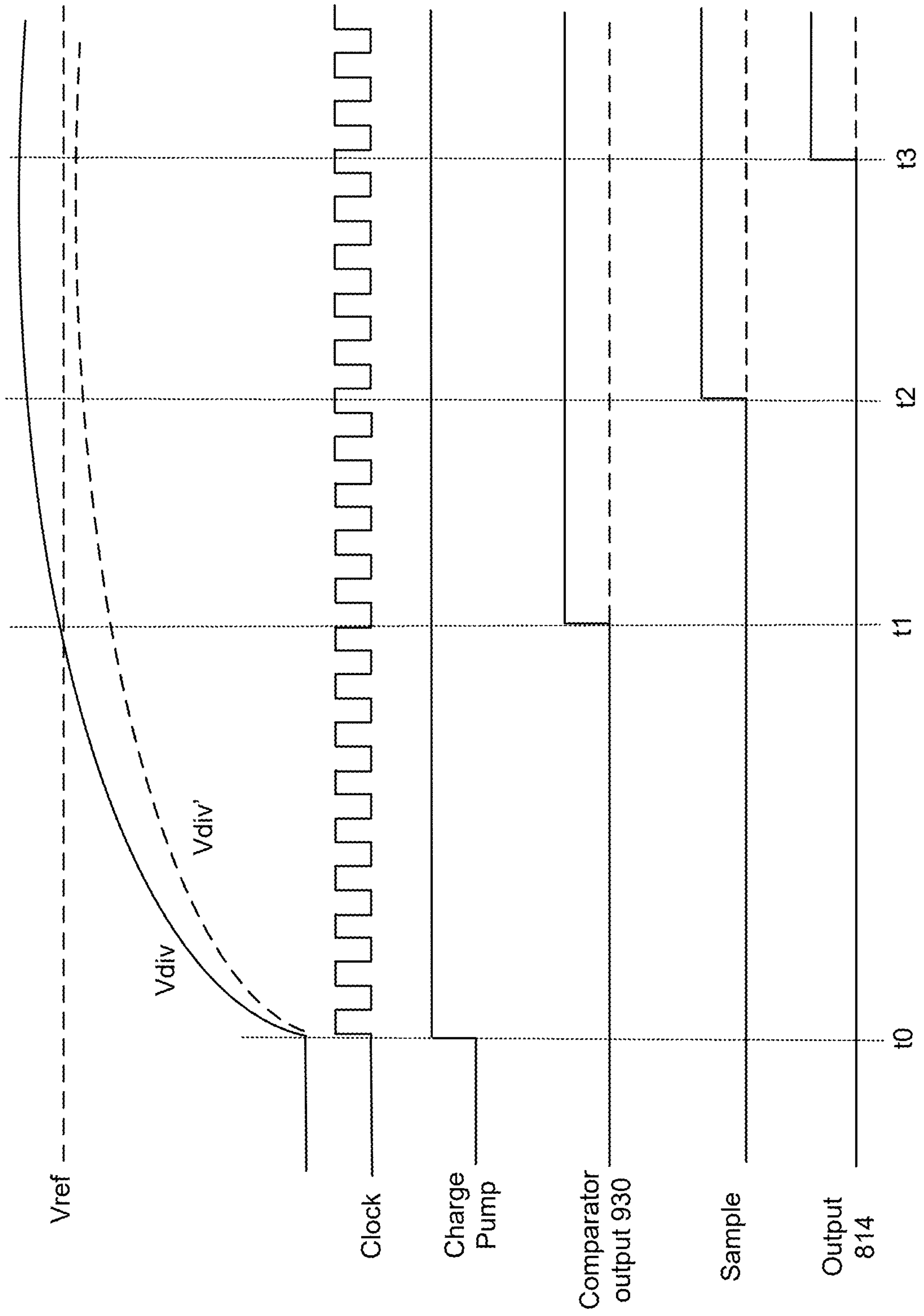
FIG. 11 illustrates an example of testing a memory access voltage.

FIG. 11 illustrates an example of a divided voltage, Vdiv, from node 922 of voltage divider 920, which is provided to comparator 924, which compares Vdiv and Vref as shown in FIG. 9. At time t0, a charge pump is turned on and a clock signal initiated to generate a selected voltage, Vsel (e.g., one of V1 to Vn), from which Vdiv is obtained. Vdiv increases from t0 and exceeds Vref at time t1, which causes comparator output 930 to go high, corresponding to a pass condition. Subsequently, at time t2, comparator output 930 is sampled (latched) by latch 932 (e.g., according to latch enable input 943). At time t3, the high output that was sampled at time t2 is provided at output terminal 814 to indicate a passing condition.

FIG. 11 also illustrates an example of a divided voltage Vdiv' (dashed line) which does not reach Vref (e.g., a fail condition occurs because the corresponding selected voltage Vsel does not reach the limit). As a result, comparator output 930 remains low at time t1 and after. The low signal is sampled at time t2 and the low signal is provided at output terminal 814 at time t3 as shown by corresponding dashed lines. The low output indicates a fail condition.

Figure 12A:
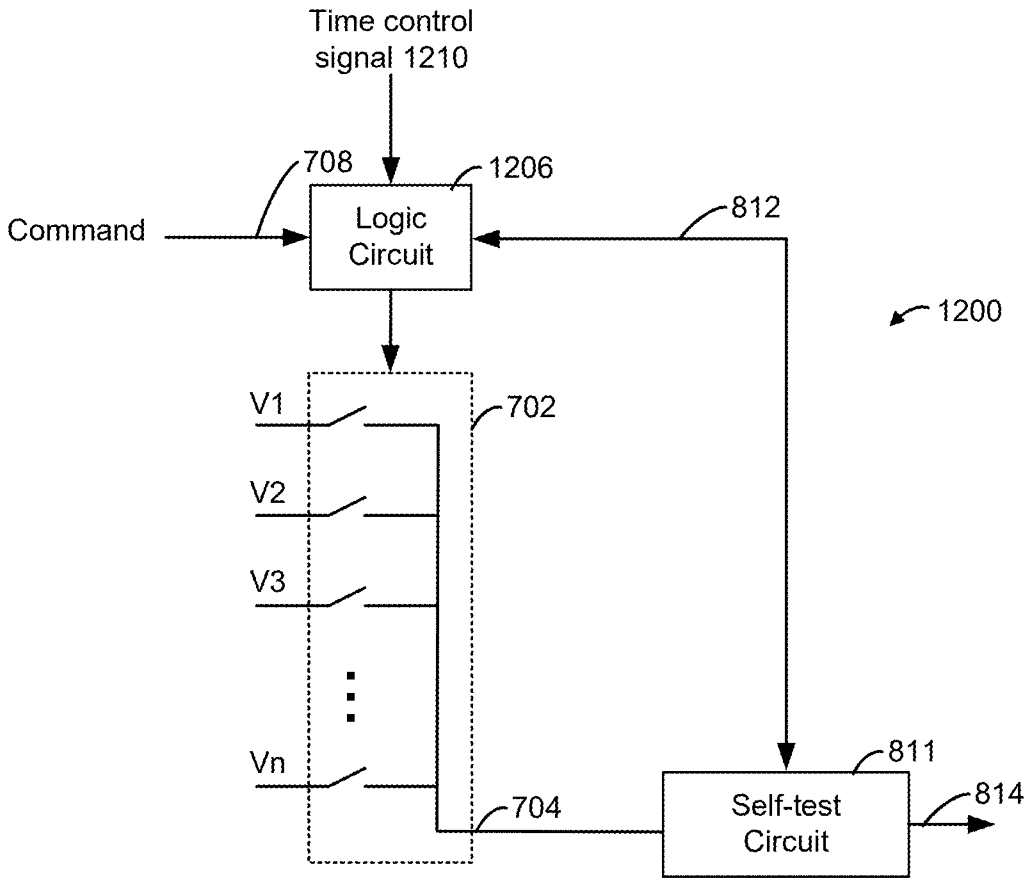
FIGS. 12A-B illustrate an example of time-controlled testing.
Figure 12B:
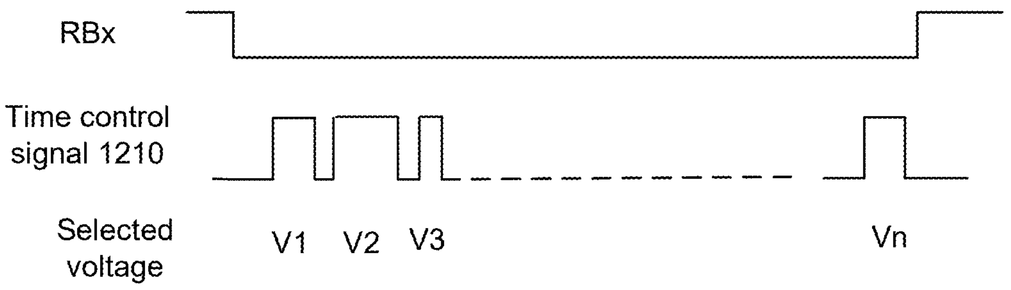

FIGS. 12A-B illustrate an example of control circuits 1200. FIG. 12A shows time control signal 1210 received by logic circuit 1206, which is used to select a memory access voltage from V1 to Vn to output at terminal 704. In some cases, time control signal 1210 may be generated internally in logic circuit 1206 (e.g., according to timing logic that may be implemented by firmware or otherwise). Using a time control signal may provide adaptability to a range of different voltages and limits and may enable rapid change from voltage to voltage (e.g., compared with using a clock signal that has equally-spaced pulses of equal pulse width).

FIG. 12B shows an example of time control signal 1210 used to select different voltages from V1 to Vn at different times. Voltages may be selected for different periods according to time control signal 1210. For example, voltage V2 may be selected for a longer period than voltage V3 as indicated by different pulse widths. Furthermore, pulses may be closely spaced so that little time is lost between testing different voltages. In some cases time control signal 1210 may be a predetermined signal according to previously known characteristics of voltages to be measured (e.g., time to reach limit and/or stabilize). In some cases, time control signal 1210 may be based on information regarding testing (e.g., from self-test circuit 811). For example, a feedback signal may be provided via connection 812 so that when a voltage reaches a reference voltage (e.g., test pass) the time control signal 1210 may cause switching to a subsequent voltage instead of waiting a predetermined period of time.

Figure 13A:
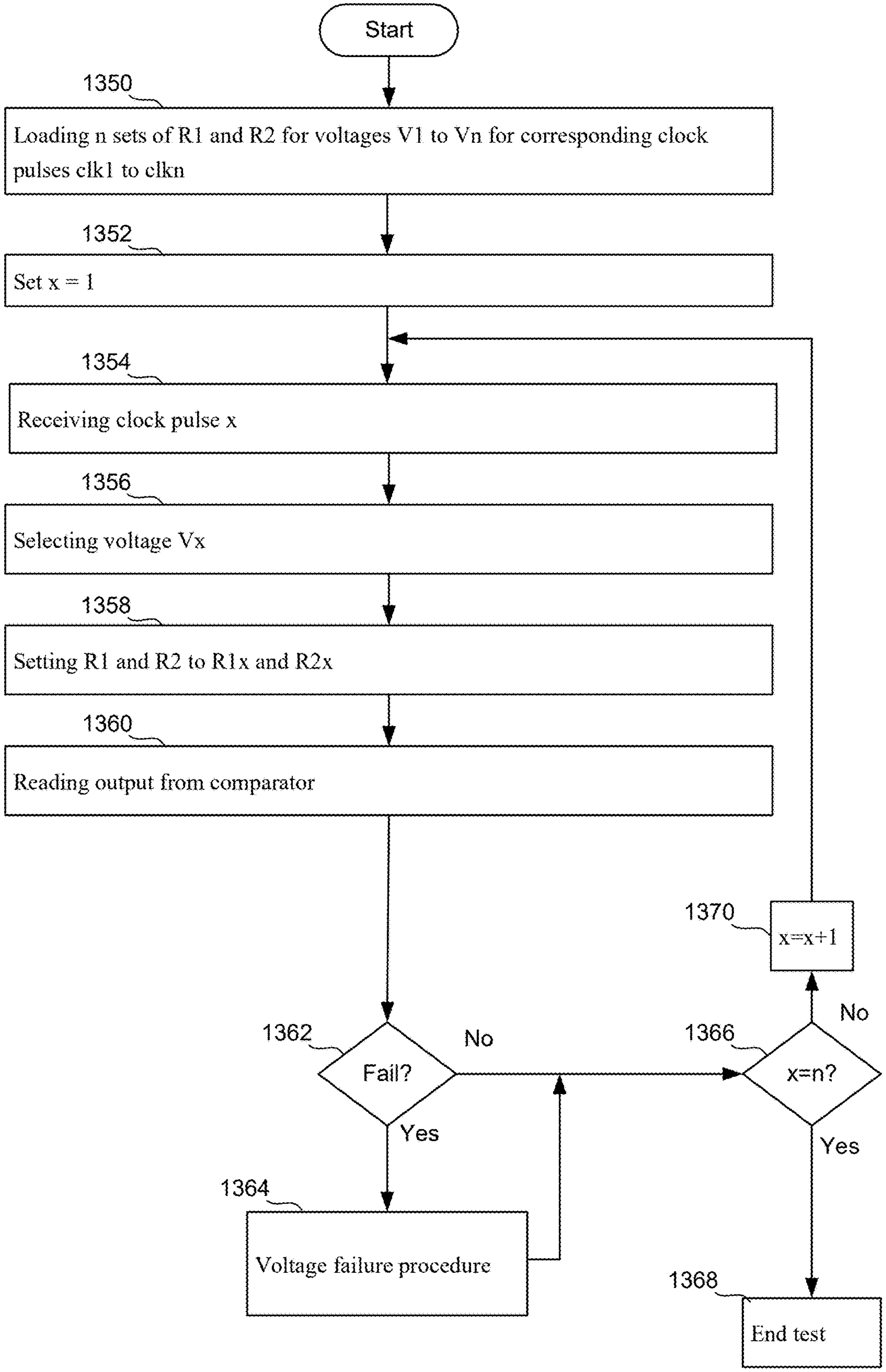
FIGS. 13A-C illustrate methods of testing voltages.

FIG. 13A illustrates an example of a method to test voltages (e.g., V1-Vn using circuits such as control circuits 800 or 1200. The method includes loading n sets of R1 and R2 for voltages V1 to Vn for corresponding clock pulses clk1 to clkn 1350 and setting x to one 1352 (e.g., initiating clock pulse numbering at one). For example, values may be loaded into registers or otherwise prepared for configuring resistors R1 and R2 to have resistance that produce corresponding divided voltages (e.g., Vdiv) from each selected voltage (Vsel) for comparison with a reference voltage (e.g., Vref). The method further includes receiving clock pulse x 1354 (e.g., clk1), selecting voltage Vx 1356 (e.g., V1), setting R1 and R2 to R1x and R2x 1358 (e.g., to values configured to divide V1 to provide a suitable value of Vdif for comparison with Vref) and reading the output from the comparator 1360 (e.g., output of comparator 924, which compares Vdif and Vref). The output of comparator 1360 (e.g., latched by latch 932) may indicate a pass or fail for each voltage (e.g., Vdif may exceed Vref or not). A determination is made as to whether a fail occurred 1362 and if it did then a voltage failure procedure 1364 is applied. Subsequently, a determination is made as to whether x=n 1366 (e.g., whether clkx is the last pulse clkn). If x=n (e.g., last pulse) then the last voltage (Vn) has been tested and testing ends 1368. If x is not equal to n (e.g., x=1) then x is incremented 1370 (e.g., X=2) and the previous steps are repeated for the next voltage (e.g., V2). The method continues to test different voltages Vx from V1 to Vn in this way until Vn is reached (e.g., x=n) and testing finishes.

Figure 13B:
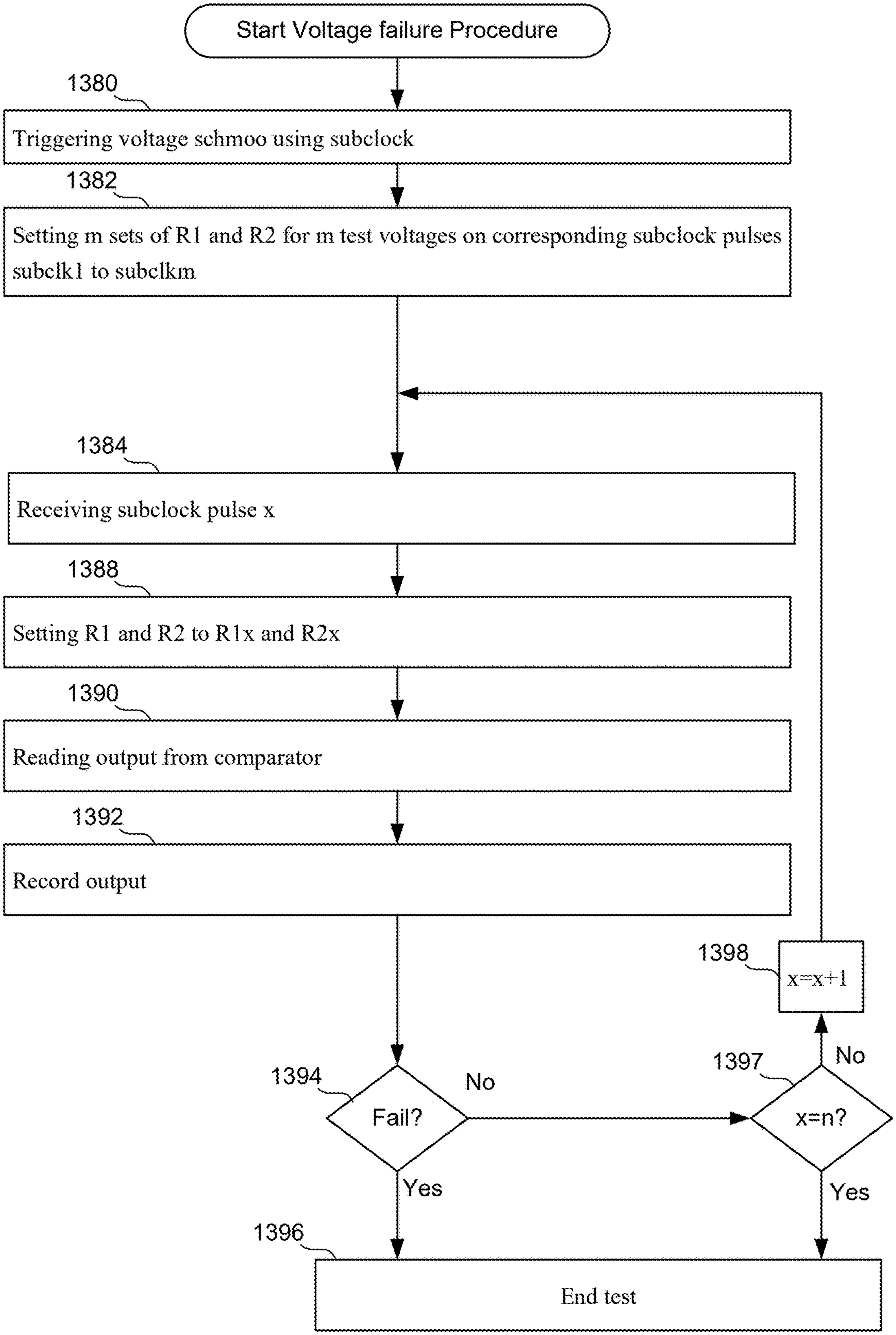

If a fail is detected at step 1362 (e.g., a voltage is below a corresponding minimum) an appropriate voltage failure procedure 1364 may be applied, for example, as shown in FIG. 13B, which shows a procedure that may be used to provide details of the failed voltage for failure analysis purposes. The method includes triggering a voltage schmoo using a subclock 1380 (e.g., a clock with a higher clock frequency than clock signal 810) and setting m sets of R1 and R2 for m test voltages on corresponding subclock pulses subclk0 to subclkm 1382. The method further includes receiving subclock pulse x 1384, setting R1 and R2 to R1x and R2x 1388, reading the output from the comparator 1390 and recording the output 1392. A determination is made 1394 as to whether a fail has occurred 1394. In the example shown, if a fail has occurred then testing ends 1396 (in other examples, testing may continue even when a fail occurs). If no fail occurs then a determination is made 1397 as to whether x=n and if x=n then testing ends 1396 (e.g., all voltage levels have been tested). If x is not equal to n then x is incremented 1398 and the previous steps are repeated until a fail occurs or n is reached.

Figure 13C:
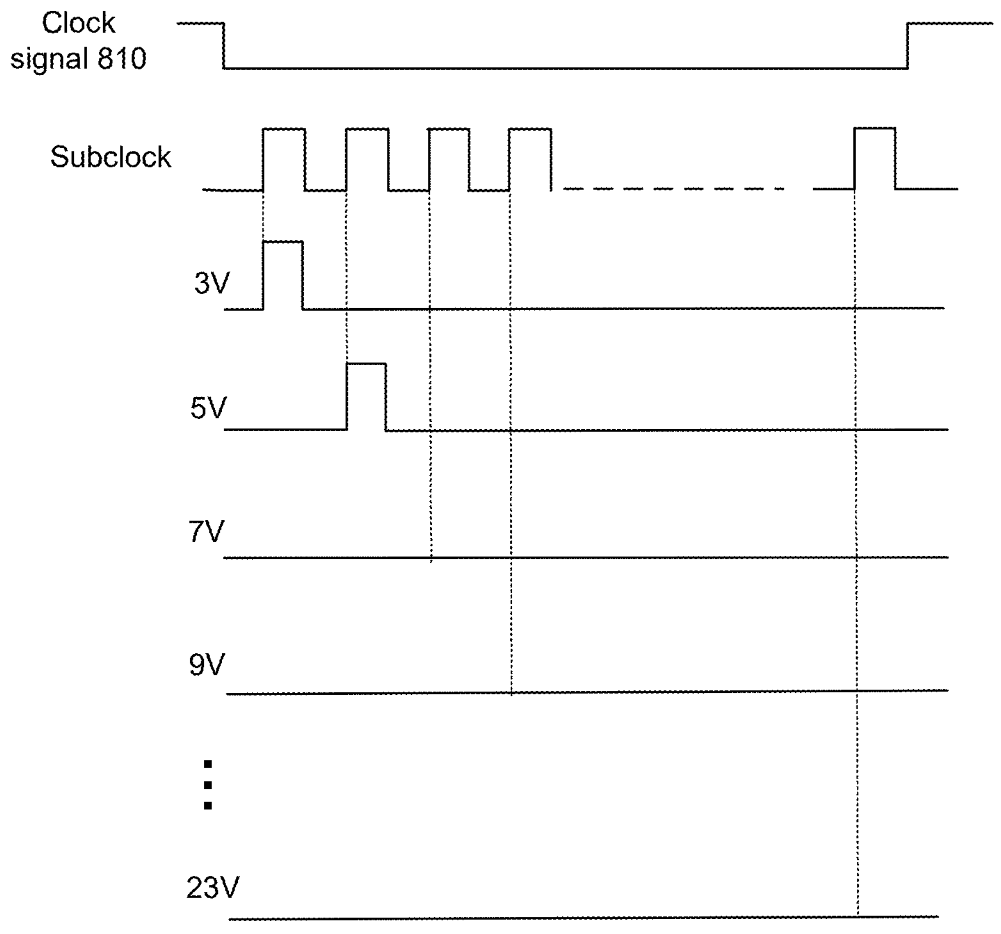

FIG. 13C shows an example of operation of the voltage failure procedure of FIG. 13B, which is implemented using a subclock with a higher clock frequency than clock signal 810. Voltages 3V, 5V, 7V, 9V and so on to 23V are tested (e.g., appropriate values of R1 and R2 are used). While testing at 3V and 5V provides a pass (signal pulse corresponding to a high signal or pass from latch 932), which indicates that the voltage being tested is greater than 5 volts, testing at 7V and higher results in a fail (no signal pulse), which indicates that the voltage being tested is less than 7V. This result may be recorded and used for failure analysis purposes.

Figure 14:
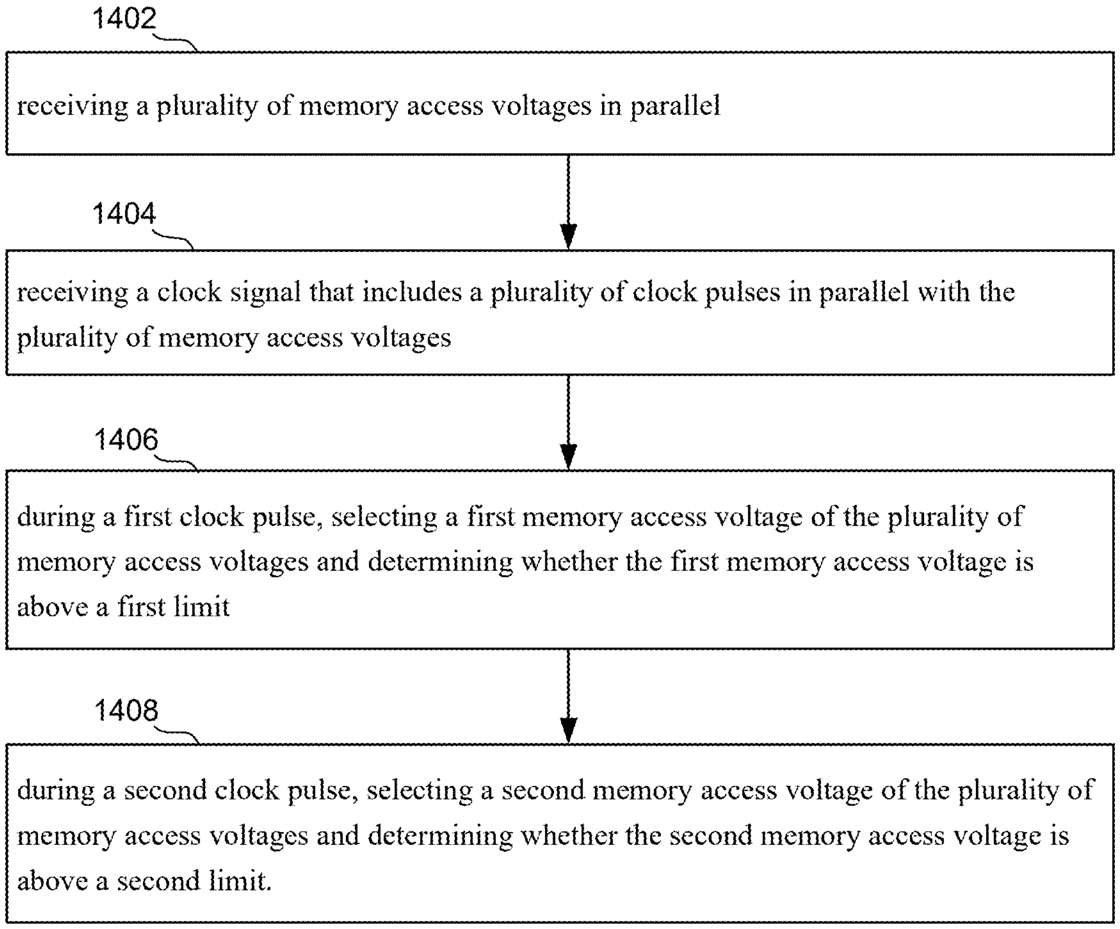
FIG. 14 illustrates a method that includes determining whether memory access voltages are above corresponding voltage limits.

FIG. 14 shows an example of a method that includes receiving a plurality of memory access voltages in parallel 1402 (e.g., V1 to Vn), receiving a clock signal that includes a plurality of clock pulses in parallel with the plurality of memory access voltages 1404, during a first clock pulse, selecting a first memory access voltage of the plurality of memory access voltages and determining whether the first memory access voltage is above a first limit 1406 (e.g., testing V1) and during a second clock pulse, selecting a second memory access voltage of the plurality of memory access voltages and determining whether the second memory access voltage is above a second limit 1408 (e.g., testing V2).

An example of an apparatus includes one or more control circuits configured to connect to a plurality of nonvolatile memory cells. The one or more control circuits are configured to receive memory access voltages in parallel with a clock signal and select a different memory access voltage during each clock pulse. The one or more control circuits are further configured to determine whether each memory access voltage meets a requirement.

In one or more examples, the plurality of memory access voltages include voltages to perform a read operation to read data from the nonvolatile memory cells.

In one or more examples, the plurality of memory access voltages include voltages to perform a write operation to write data in the nonvolatile memory cells.

In one or more examples, the one or more control circuits include a voltage divider that receives a selected memory access voltage and provides a predetermined fraction of the selected memory access voltage as a voltage divider output.

In one or more examples, the voltage divider includes one or more variable resistor that is configurable according to a corresponding fraction of the selected memory access voltage to be output.

In one or more examples, the one or more control circuits include a control circuit connected to the one or more variable resistor and configured to control resistance of the one or more variable resistor to cause the voltage divider to output the predetermined fraction of the selected memory access voltage.

In one or more examples, the voltage divider output is connected to a first input of a comparator and a second input of the comparator is connected to a reference voltage that is selected according to the requirement.

In one or more examples, the one or more control circuits are further configured apply a sequence of reference voltages to the second input to determine a voltage range of the selected memory access voltage in response to determining that the selected memory access voltage does not meet the requirement.

In one or more examples, the one or more control circuits are located on a control die and the plurality of nonvolatile memory cells are located on a second die that is coupled to the control die in an integrated memory assembly.

An example of a method includes receiving a plurality of memory access voltages in parallel; receiving a clock signal that includes a plurality of clock pulses in parallel with the plurality of memory access voltages; during a first clock pulse, selecting a first memory access voltage of the plurality of memory access voltages and determining whether the first memory access voltage is above a first limit; and during a second clock pulse, selecting a second memory access voltage of the plurality of memory access voltages and determining whether the second memory access voltage is above a second limit.

In one or more examples, the plurality of memory access voltages are memory access voltages for a read operation, the first memory access voltage is a read voltage and the second memory access voltage is a read pass voltage.

In one or more examples, the plurality of memory access voltages are memory access voltages for a write operation, the first memory access voltage is a program voltage and the second memory access voltage is a write pass voltage.

In one or more examples, the plurality of memory access voltages are memory access voltages for an erase operation, the first memory access voltage is an erase voltage and the second memory access voltage is a select voltage.

In one or more examples, the method further includes applying the first memory access voltage to a voltage divider and comparing an output of the voltage divider with a first reference voltage to determine if the first memory access voltage is above the first limit; and applying the second memory access voltage to the voltage divider and comparing an output of the voltage divider with a second reference voltage to determine if the second memory access voltage is above the second limit.

In one or more examples, the method further includes in response to determining that the first memory access voltage is not above the first limit or the second memory access voltage is not above the second limit, designating at least a portion of a memory die connected to the first and second memory access voltages as defective.

In one or more examples, the method further includes in response to determining that the first memory access voltage is not above the first limit or the second memory access voltage is not above the second limit, designating at least a portion of a memory die connected to the first and second memory access voltages as defective.

In one or more examples, the method further includes during each additional clock pulse of additional clock pulses of the plurality of clock pulses, selecting a different additional memory access voltage of the plurality of memory access voltages and determining whether the additional memory access voltage is above a corresponding additional limit.

In one or more examples, the method further includes in response to determining that the first memory access voltage is above the first limit, the second memory access voltage is above the second limit and the additional memory access voltage is above the corresponding additional limit, designating at least a portion of a memory die connected to the first, second and additional memory access voltages as non-defective.

An example of a memory system includes a plurality of nonvolatile memory cells; a plurality of driver circuits configured to provide a plurality of memory access voltages to the plurality of nonvolatile memory cells in memory access operations; and means for selecting a different memory access voltage of the plurality of memory access voltages during each clock pulse and for each memory access voltage of the plurality of memory access voltages, determining whether the memory access voltage exceeds a corresponding voltage limit.

In some examples, the plurality of nonvolatile memory cells are located on a memory die, the plurality of driver circuits and the means for selecting are located on a control die and the memory die is bonded to the control die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
- one or more control circuits configured to connect to a plurality of nonvolatile memory cells, the one or more control circuits are configured to:
  - receive a plurality of memory access voltages in parallel with a clock signal that includes a plurality of clock pulses, select a different memory access voltage of the plurality of memory access voltages during each clock pulse and for each memory access voltage of the plurality of memory access voltages, determine whether the memory access voltage meets a requirement.

2. The apparatus of claim 1, wherein the plurality of memory access voltages include voltages to perform a read operation to read data from the nonvolatile memory cells.

3. The apparatus of claim 1, wherein the plurality of memory access voltages include voltages to perform a write operation to write data in the nonvolatile memory cells.

4. The apparatus of claim 1, wherein the one or more control circuits include a voltage divider that receives a selected memory access voltage and provides a predetermined fraction of the selected memory access voltage as a voltage divider output.

5. The apparatus of claim 4, wherein the voltage divider includes one or more variable resistor that is configurable according to a corresponding fraction of the selected memory access voltage to be output.

6. The apparatus of claim 5, wherein the one or more control circuits include a control circuit connected to the one or more variable resistor and configured to control resistance of the one or more variable resistor to cause the voltage divider to output the predetermined fraction of the selected memory access voltage.

7. The apparatus of claim 4, wherein the voltage divider output is connected to a first input of a comparator and a second input of the comparator is connected to a reference voltage that is selected according to the requirement.

8. The apparatus of claim 7, wherein the one or more control circuits are further configured apply a sequence of reference voltages to the second input to determine a voltage range of the selected memory access voltage in response to determining that the selected memory access voltage does not meet the requirement.

9. The apparatus of claim 1, wherein the one or more control circuits are located on a control die and the plurality of nonvolatile memory cells are located on a second die that is coupled to the control die in an integrated memory assembly.

10. A method comprising:
- receiving a plurality of memory access voltages in parallel;
- receiving a clock signal that includes a plurality of clock pulses in parallel with the plurality of memory access voltages;
- during a first clock pulse, selecting a first memory access voltage of the plurality of memory access voltages and determining whether the first memory access voltage is above a first limit; and
- during a second clock pulse, selecting a second memory access voltage of the plurality of memory access voltages and determining whether the second memory access voltage is above a second limit.

11. The method of claim 10, wherein the plurality of memory access voltages are memory access voltages for a read operation, the first memory access voltage is a read voltage and the second memory access voltage is a read pass voltage.

12. The method of claim 10, wherein the plurality of memory access voltages are memory access voltages for a write operation, the first memory access voltage is a program voltage and the second memory access voltage is a write pass voltage.

13. The method of claim 10, wherein the plurality of memory access voltages are memory access voltages for an erase operation, the first memory access voltage is an erase voltage and the second memory access voltage is a select voltage.

14. The method of claim 10, further comprising:
- applying the first memory access voltage to a voltage divider and comparing an output of the voltage divider with a first reference voltage to determine if the first memory access voltage is above the first limit; and applying the second memory access voltage to the voltage divider and comparing an output of the voltage divider with a second reference voltage to determine if the second memory access voltage is above the second limit.

15. The method of claim 10, further comprising:

in response to determining that the first memory access voltage is not above the first limit or the second memory access voltage is not above the second limit, designating at least a portion of a memory die connected to the first and second memory access voltages as defective.

16. The method of claim 10, further comprising in response to determining that the first memory access voltage is not above the first limit, determining whether the first memory access voltage is above each additional voltage of a plurality of additional voltages to identify a voltage range of the first memory access voltage.

17. The method of claim 10, further comprising:

during each additional clock pulse of additional clock pulses of the plurality of clock pulses, selecting a different additional memory access voltage of the plurality of memory access voltages and determining whether the additional memory access voltage is above a corresponding additional limit.

18. The method of claim 17, further comprising:

in response to determining that the first memory access voltage is above the first limit, the second memory access voltage is above the second limit and the additional memory access voltage is above the corresponding additional limit, designating at least a portion of a memory die connected to the first, second and additional memory access voltages as non-defective.

19. A memory system comprising:

a plurality of nonvolatile memory cells;

a plurality of driver circuits configured to provide a plurality of memory access voltages to the plurality of nonvolatile memory cells in memory access operations; and means for selecting a different memory access voltage of the plurality of memory access voltages during each clock pulse and for each memory access voltage of the plurality of memory access voltages, determining whether the memory access voltage exceeds a corresponding voltage limit.

20. The memory system of claim 19, wherein the plurality of nonvolatile memory cells are located on a memory die, the plurality of driver circuits and the means for selecting are located on a control die and the memory die is bonded to the control die.

* * * * *